United States Patent
Takagi

(10) Patent No.: US 6,793,734 B2
(45) Date of Patent: Sep. 21, 2004

(54) HEATING FURNACE AND SEMICONDUCTOR WAFER-HOLDING JIG ASSEMBLY AND PROCESS OF MANUFACTURING SEMICONDUCTOR DEVICES

(75) Inventor: Mikio Takagi, Kawasaki (JP)

(73) Assignees: F.T.L. Co., Ltd., Kawasaki (JP); Topco Scietific Co., Ltd., Taipei (TW)

( * ) Notice: Subject to any disclaimer, the term of this patent is extended or adjusted under 35 U.S.C. 154(b) by 186 days.

(21) Appl. No.: 10/202,698

(22) Filed: Jul. 25, 2002

(65) Prior Publication Data

US 2003/0031974 A1 Feb. 13, 2003

(30) Foreign Application Priority Data

Jul. 26, 2001 (JP) ........................................ 2001-225713

(51) Int. Cl.[7] ........................ C23C 23/00; A47G 19/08; F27D 5/00; H01L 21/306
(52) U.S. Cl. ........................ 118/715; 118/724; 118/725; 118/728; 118/729; 432/253; 432/258; 432/241; 211/41.18
(58) Field of Search ................................ 118/715, 724, 118/725, 728, 729; 432/253, 258, 241; 211/41.18

(56) References Cited

U.S. PATENT DOCUMENTS

| | | | | |
|---|---|---|---|---|
| 4,096,822 A | * | 6/1978 | Yamawaki et al. | 118/729 |
| 4,466,381 A | * | 8/1984 | Jenkins | 118/728 |
| 4,558,660 A | * | 12/1985 | Nishizawa et al. | 118/725 |
| 4,819,579 A | * | 4/1989 | Jenkins | 118/728 |
| 4,911,638 A | * | 3/1990 | Bayne et al. | 432/152 |
| 5,429,498 A | * | 7/1995 | Okase et al. | 432/152 |
| 5,443,648 A | * | 8/1995 | Ohkase | 118/724 |
| 5,520,742 A | * | 5/1996 | Ohkase | 118/724 |
| 5,536,918 A | * | 7/1996 | Ohkase et al. | 219/390 |
| 5,662,469 A | * | 9/1997 | Okase et al. | 432/6 |
| 5,743,967 A | * | 4/1998 | Kobori et al. | 118/724 |
| 5,763,856 A | * | 6/1998 | Ohkase | 219/390 |
| 5,903,711 A | * | 5/1999 | Okase | 392/418 |
| 6,001,175 A | * | 12/1999 | Maruyama et al. | 117/102 |
| 6,159,873 A | * | 12/2000 | Takagi | 438/795 |
| 6,462,411 B1 | * | 10/2002 | Watanabe et al. | 257/723 |
| 2003/0031974 A1 | * | 2/2003 | Takagi | 432/253 |

FOREIGN PATENT DOCUMENTS

| | | | |
|---|---|---|---|
| JP | 58-116724 | * | 7/1983 |
| JP | 62-299017 | * | 12/1987 |
| JP | 64-071118 | * | 3/1989 |
| JP | 64-071119 | * | 3/1989 |
| JP | 02-069932 | * | 3/1990 |
| JP | 02-216820 | * | 8/1990 |
| JP | 07-006873 | * | 1/1995 |
| JP | 10-177963 | * | 6/1998 |

* cited by examiner

Primary Examiner—Jeffrie R. Lund
(74) Attorney, Agent, or Firm—Thomas, Kayden, Horstemeyer & Risley

(57) ABSTRACT

An assembly of heating furnace and semiconductor wafer-holding jig. This assembly includes a furnace body made of refractory or heat insulting material; a heater disposed around the inner side surface of the furnace body; a reaction chamber which forms a uniform heating zone; and a wafer-holding jig. The wafer-holding jig is capable of holding the wafer and advancing and retracting the wafer in the uniform heating region along the longitudinal direction of the furnace body. The front surface of the semiconductor wafer to be heat-treated is substantially in parallel with the surface of the heater. The assembly of the invention can be used in rapid thermal processing and the footprint of the heating furnace can be reduced.

4 Claims, 11 Drawing Sheets

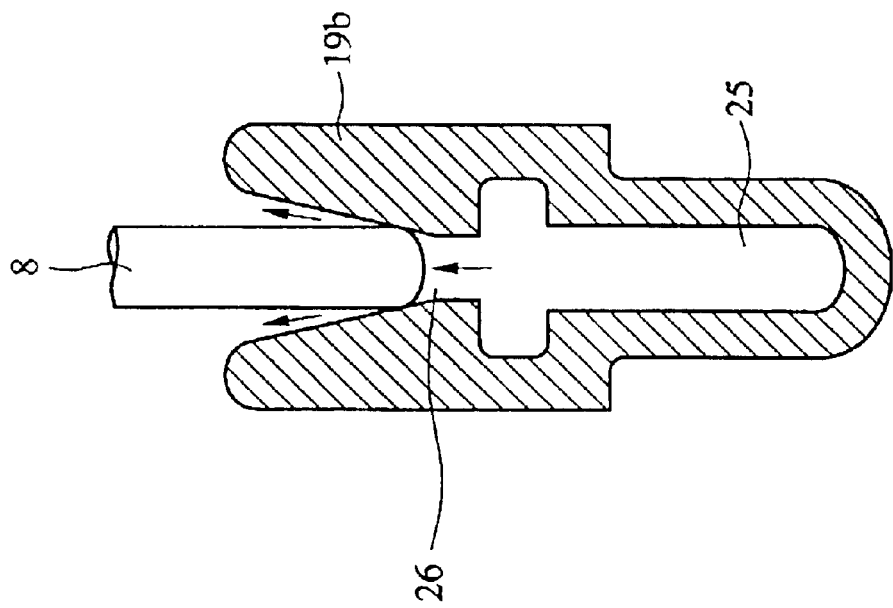
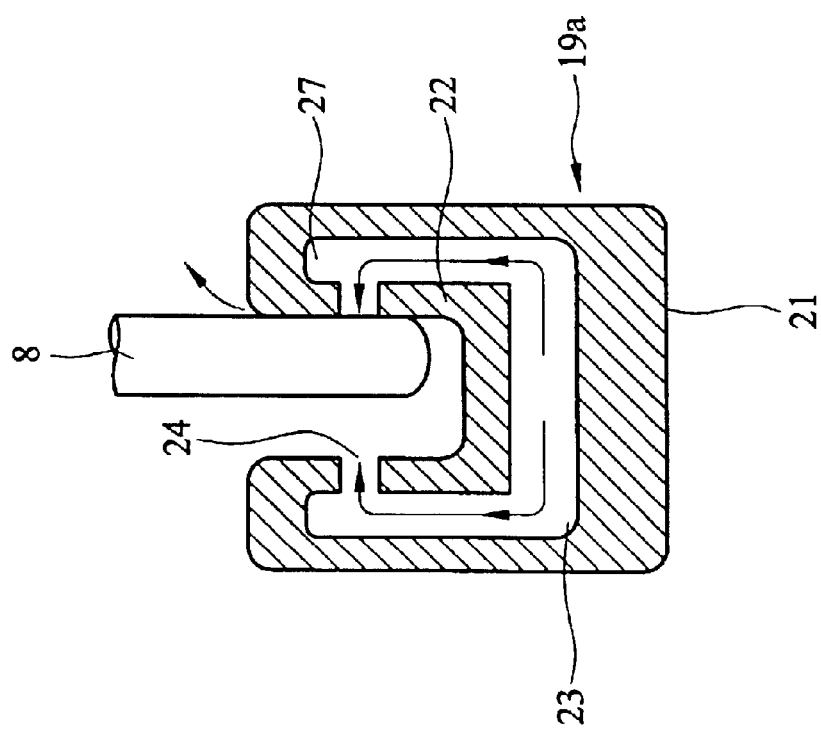

HEATING FURNACE AND SEMICONDUCTOR WAFER-HOLDING JIG ASSEMBLY AND PROCESS OF MANUFACTURING SEMICONDUCTOR DEVICES

BACKGROUND OF THE INVENTION

1. Field of the Invention

The present invention relates to an assembly of a hot wall-heating furnace used in the process of manufacturing various semiconductor devices, including the CVD process and diffusion process, and a semiconductor wafer-holding jig. The present invention also relates to a process of manufacturing semiconductor devices using this assembly.

2. Description of the Related Art

Semiconductor manufacturing apparatuses using a hot wall-heating furnace are well known. For example, in the Conference of Applied Physics, (No. 55, Nagoya, Japan, Sep. 19–22, 1994), it is reported that, in rapid thermal annealing (RTA), moving a wafer between a low temperature zone and a high temperature zone, disposed respectively at the top and bottom portion of a vertical hot wall heating furnace, can obtain a better sheet resistance distribution in the wafer surface than that by using an ordinary RTA. It is also reported that in RTA, five wafers are heat-treated at a temperature of 1000° C. for 10 seconds to produce CMOS devices by using the above-mentioned vertical heating furnace (3rd International Rapid Thermal Processing conference, RTP '95. Aug. 30–Sep. 1, 1995, Amsterdam, Netherlands, THE EFFECTS OF RAPID THERMAL PROCESSING ON QUARTER MICRON CMOS DEVICES, pp 101–103). It is also reported that this type of furnace is suitable for use in the reflow process ($4^{th}$ Int. Conf. On Advanced Thermal Processing of Semiconductors-RTP, '96, 30–33), and in the annealing of gigabit DRAM devices ($4^{th}$ Int. Conf., On Advanced Thermal Processing of Semiconductors, RTP '96).

FIG. 1 shows the main structure of a vertical single wafer heating furnace having excellent temperature distribution. Referring to FIG. 1, 1 is a furnace body made of refractory or heat insulating material. 2 is a heater. 3 is a reaction chamber made of quartz. 4 is a gas introduction conduit opened at the top of the reaction chamber 3 for feeding reaction gas from the bottom portion of the furnace. 5 is a furnace floor plate. 6 is a lifting rod which is elevated and rotated in the furnace body in the heat treatment process. 7 is a wafer holding portion extended upwards obliquely from the lifting rod 6. 8 is a wafer. 9 is a claw extended horizontally from the wafer holding portion for holding the back surface of the wafer. 10 is an O-ring. 11 is an exhaust conduit opened at the bottom of the reaction chamber 3. By using a heating furnace having such a structure, the temperature distribution of the wafer 8 is influenced by the distance from the heater 2, and thus the temperature at the center of the wafer is high while the temperature in the peripheral portion is low.

In order to make the temperature distribution of the front surface of the wafer uniform, the applicant of this application has proposed a method that has been patented in the United States as U.S. Pat. No. 6,159,873. According to the patented method, thermal storage plates having substantially the same size of the wafer are disposed in the heating furnace, and are preliminarily heated to a heat-treating temperature, and then the wafer is positioned to the proximity of the thermal storage plates. By using both the heat from the heater and from the thermal storage plates, it is possible to make temperature distribution of the front surface of the wafer uniform and raise the temperature of the wafer rapidly. In the article published in the Conference of Applied Physics, Spring, 1998, the effect of the thermal storage plates has been investigated and studied by means of simulation by the inventors of said US patent.

Moreover, U.S. Pat. No. 6,159,873 disclosed several embodiments of the use of thermal storage plates as heaters. In FIG. 12 of the US patent, it is shown that the front surface of the wafer is positioned in the direct proximity of the heater that is mounted in the flat ceiling portion of the furnace. In this manner, as the wafer and the heater are positioned close to each other, the temperature distribution of the front surface of the wafer can be significantly improved.

According to the method of the US patent, since the wafer is positioned in direct proximity of the heater mounted in the ceiling portion of the furnace, the temperature distribution is improved. However, because the section of the heating furnace is circular in shape, the clean room footprint of the furnace is big. As the building cost of a clean room for accommodating a heating furnace for manufacturing semiconductor devices is high, it is desirable to reduce the clean room footprint of the heating furnace.

SUMMARY OF THE INVENTION

An object of the present invention is to provide an assembly of a heating furnace and wafer-holding jig that can significantly reduce the clean room footprint of the heating furnace.

Another object of this invention is to provide a process of manufacturing semiconductor devices using the assembly of the invention.

In the heat treatment of semiconductor wafers (hereinafter wafer(s)), if the wafers are horizontally supported in a vertical heating furnace, the footprint is larger than the surface area of the wafers. Moreover, if the wafers are held upright in a horizontal heating furnace, similarly, the footprint is larger than the surface area of the wafers. In any case, the size of the heating furnace becomes larger. In order to make the front surface of the wafer be consistent with the longitudinal axes of the furnace, i.e., the vertical axes of a vertical heating furnace or the horizontal axes of a horizontal heating furnace, the wafer-holding jig is usually assembled with the heating furnace.

It has been found by the inventors that by changing the sectional profile of the heating furnace in such a manner that the front surface of the wafer is parallel to the inner side surface of the furnace, the above objects can be attained.

Specifically, the assembly of heating furnace and semiconductor wafer-holding jig of the invention includes a furnace body made of refractory or heat insulting material; a heater disposed around the inner side surface of the furnace body; a reaction tube which forms a uniform heating zone; and a wafer-holding jig capable of holding the wafer, and advancing and retracting in the uniform heating zone along the longitudinal axes of the furnace body. The assembly of the invention is characterized in that the front surface of the wafer is held on the wafer-holding jig in such a manner that the front surface is substantially in parallel with the surface of the heater.

According to an aspect of the invention, the assembly can be applied in a vertical heating furnace or a horizontal-heating furnace.

According to another aspect of the invention, the assembly can include a plurality of thermal storage plates disposed in the uniform heating zone. The thermal storage plates are of the same size, or are smaller than the wafers, and are disposed substantially in parallel with one of the wafers or between two wafers.

According to a further aspect of the invention, the assembly of the invention can be used in rapid thermal processing (RTP) including RTA (Rapid Thermal Annealing), RTO (Rapid Thermal Oxidation), RTN (Rapid Thermal Nitriding), RTCVD (Rapid Thermal Chemical Vapor Deposition), and RT-Wet Reflowing. When the assembly of the invention is used in a RTA, the temperature of the furnace is raised or lowered at a rate of 10–150° C./sec and kept for 0–20 seconds at the heat-treating temperature. Under the same conditions above, the assembly can be used in RTO to form thin oxide film, and in RTN to form nitride film on the silicon surface. The assembly also can be used in atmosphere of CVD gas, under the same conditions, to form a CVD film. The assembly can also be used in high temperature steam to reflow a film of BPSG. By using the assembly of the invention, RTP can be applied on 8–12 inch CVD film.

According to a further aspect of the invention, the assembly of the invention also includes a gas-introduction hollow conduit disposed along the longitudinal axes of the heating furnace. The gas-guiding hollow conduit is communicated with the wafer-holding jig. The wafer-holding jig includes a wafer-holding portion having an ejecting hole for ejecting a gas that is inert to the wafer from the gas introduction hollow conduit.

BRIEF DESCRIPTION OF THE DRAWINGS

The present invention can be more fully understood by reading the subsequent detailed description in conjunction with the preferred embodiments and references made to the accompanying drawing, wherein:

FIG. 8 illustrates an embodiment of the structure of the claw portion of the wafer-holding jig, which is a sectional view taken from C—C of FIG. 7;

FIG. 9 illustrates another embodiment of the structure of the claw portion of the wafer-holding jig, which is a sectional view taken from B—B of FIG. 7;

DETAILED DESCRIPTION OF THE INVENTION

Figure 1:
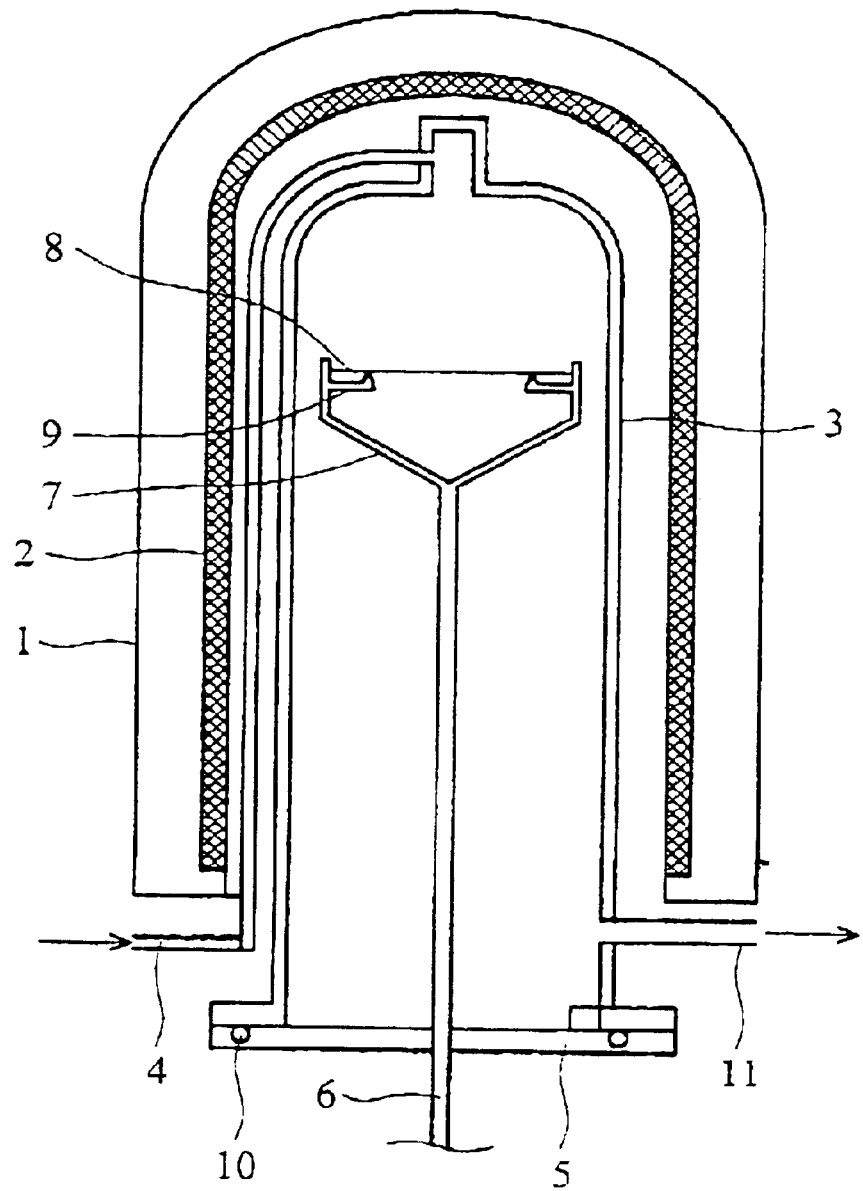
FIG. 1 illustrates an embodiment of a vertical single wafer hot wall heating furnace according to the prior art.
Figure 2:
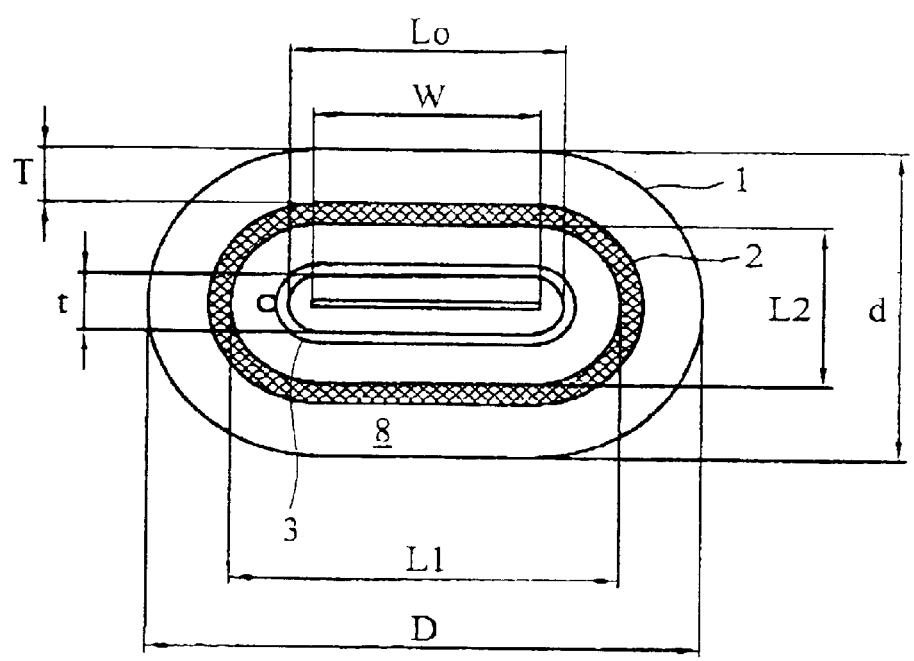
FIG. 2 is a cross-sectional view, taken from A—A of FIG. 3, illustrating an embodiment of an assembly of vertical heating furnace and vertically disposed wafer-holding jig according to the present invention.
Figure 3:
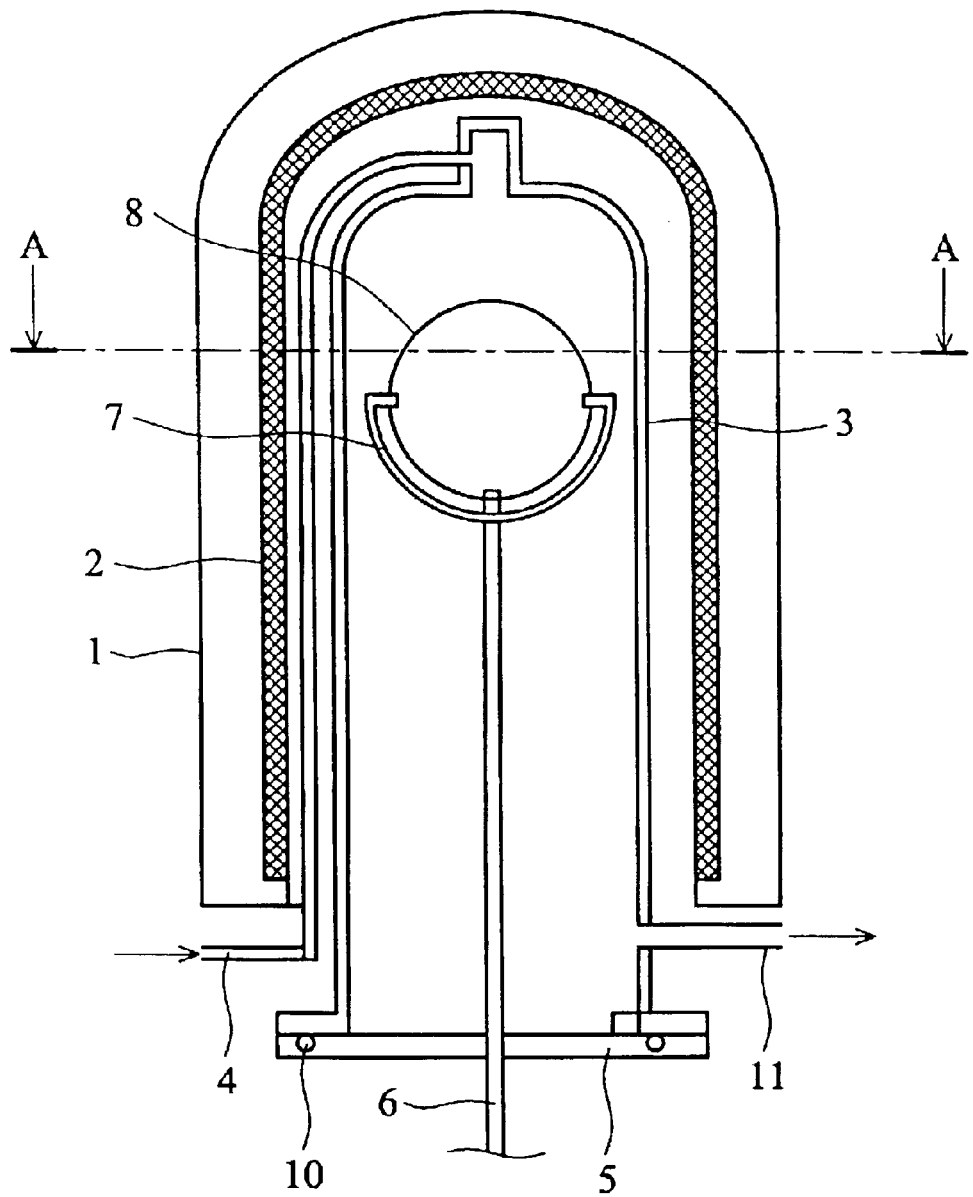
FIG. 3 is a vertical-sectional view of the furnace shown in FIG. 2.

Referring to FIGS. 2 and 3, it should be noted that the same portions of the heating furnace as illustrated in FIG. 1 are given the same reference numerals. As can be seen from FIG. 2 and FIG. 3, wafer 8 is held upright in the vertical heating furnace. The heater 2 of the heating furnace is disposed around the inner side surface of the furnace body 1 and is not arranged in a circular shape as in a conventional heating furnace. The cross-sectional profile of heater 2 is arranged in an oblong shape comprising a straight line connected with a curved line, as can be seen in FIG. 2. As a result, the uniformity of the temperature distribution of the front surface of the wafers can be increased and the footprint of the heating furnace is reduced. In these figures, w is the diameter of the wafer, and when w equals 12 inches, $L_0$ (length of the reaction tube) equals 400 mm, $L_1$ (maximum diameter of heater 2) equals 410 mm, $L_2$ (minimum diameter of heater 2) equals 70 mm, t (minimum diameter of reaction tube) equals 50 mm, and T (thickness of the furnace wall) equals 70 mm. Note that although only one wafer is shown in FIG. 2, two wafers can be held in parallel according to the present invention. It can be understood from FIG. 2 that the products of d×D and D×D($D^2$) respectively approximate to the footprint of the heating furnace disclosed and a conventional furnace. Accordingly, the reduction rate of the footprint according to the present invention can be denoted by d/D, which is about 30–50%.

Figure 4:
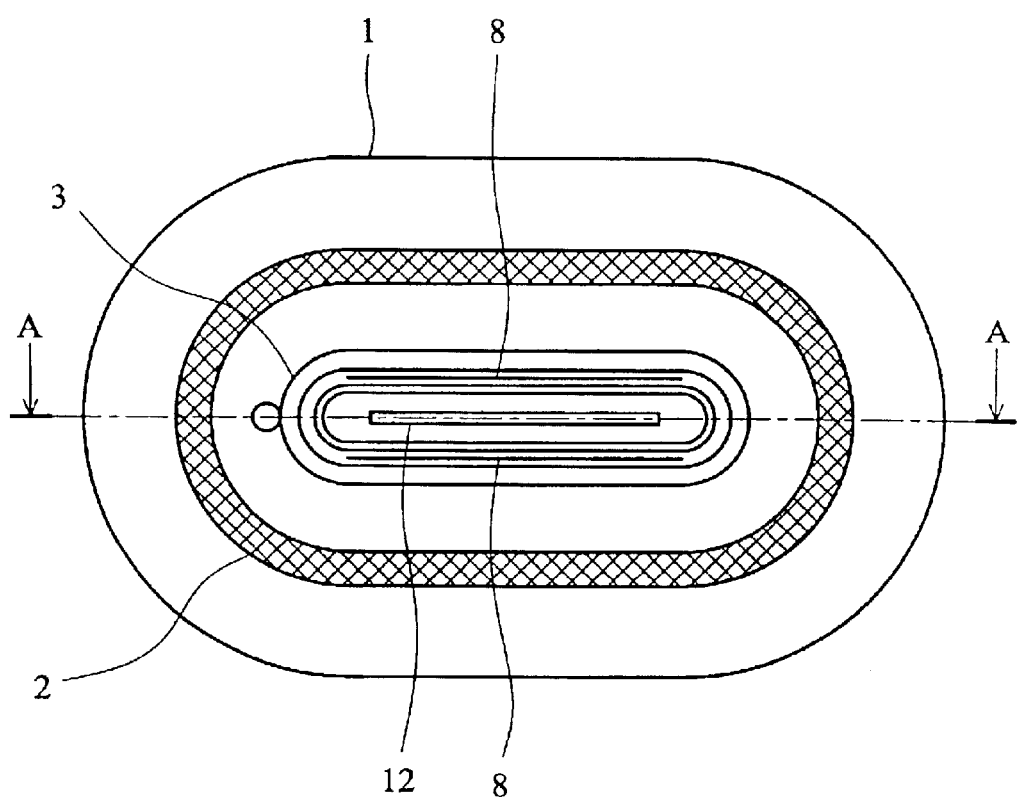
FIG. 4 is a cross-sectional view illustrating an embodiment of an assembly of vertical heating furnace, wafer-holding jig and thermal storage plate according to the present invention.
Figure 5:
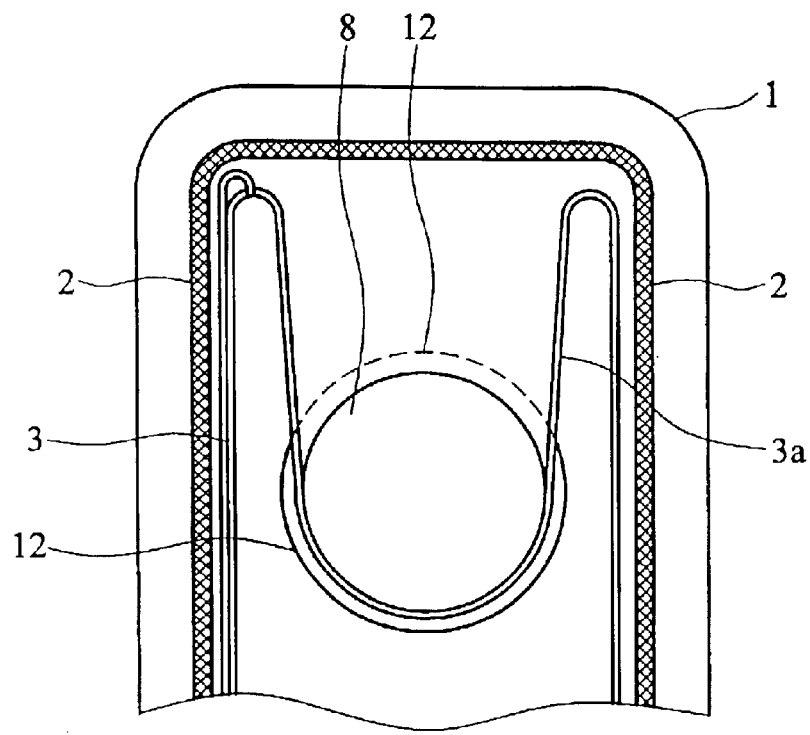
FIG. 5 is a sectional view taken from A—A of FIG. 4.

The structures as shown in FIG. 4 and FIG. 5 are respectively a modified structure of FIG. 2 and FIG. 3 with the addition of thermal storage plates 12 for simultaneously heat-treating two wafers. That is to say the thermal storage plates 12 have nothing to do with the loading of the wafers 8 and are disposed in the uniform heating zone of the heating furnace. Moreover, similar to U.S. Pat. No. 6,159,873, the thermal storage plates 12 are disposed between the two upright held wafers 8. Note that the thermal storage plate 12 has the same size as the wafers 8. If the thermal storage plate 12 has a bigger size than the wafers 8, then temperature non-uniformity will occur, and the uniformity of temperature distribution can not be obtained. The thermal storage plates 12 are held in the recessed portion 3a of the upper reaction chamber 3. By using the heating furnace having a structure as shown in FIG. 4 and FIG. 5, two wafers can be heat-treated at same temperature distribution profile as described in FIG. 1. Moreover, the footprint ratio corresponding to the number of the wafers is two times of that of the heating furnace of FIG. 2.

Figure 6:
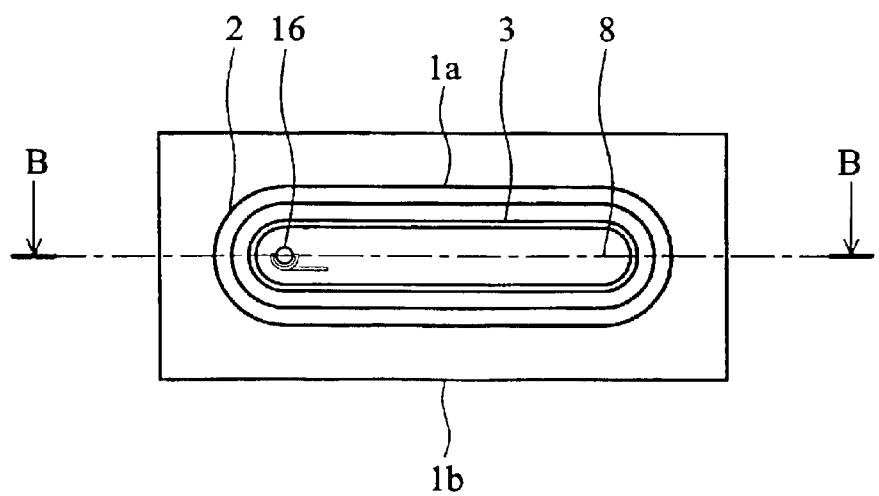
FIG. 6 illustrates an embodiment of an assembly of a horizontal heating furnace and vertically disposed wafer-holding jig, which is a sectional view taken from A—A of FIG. 7.
Figure 7:
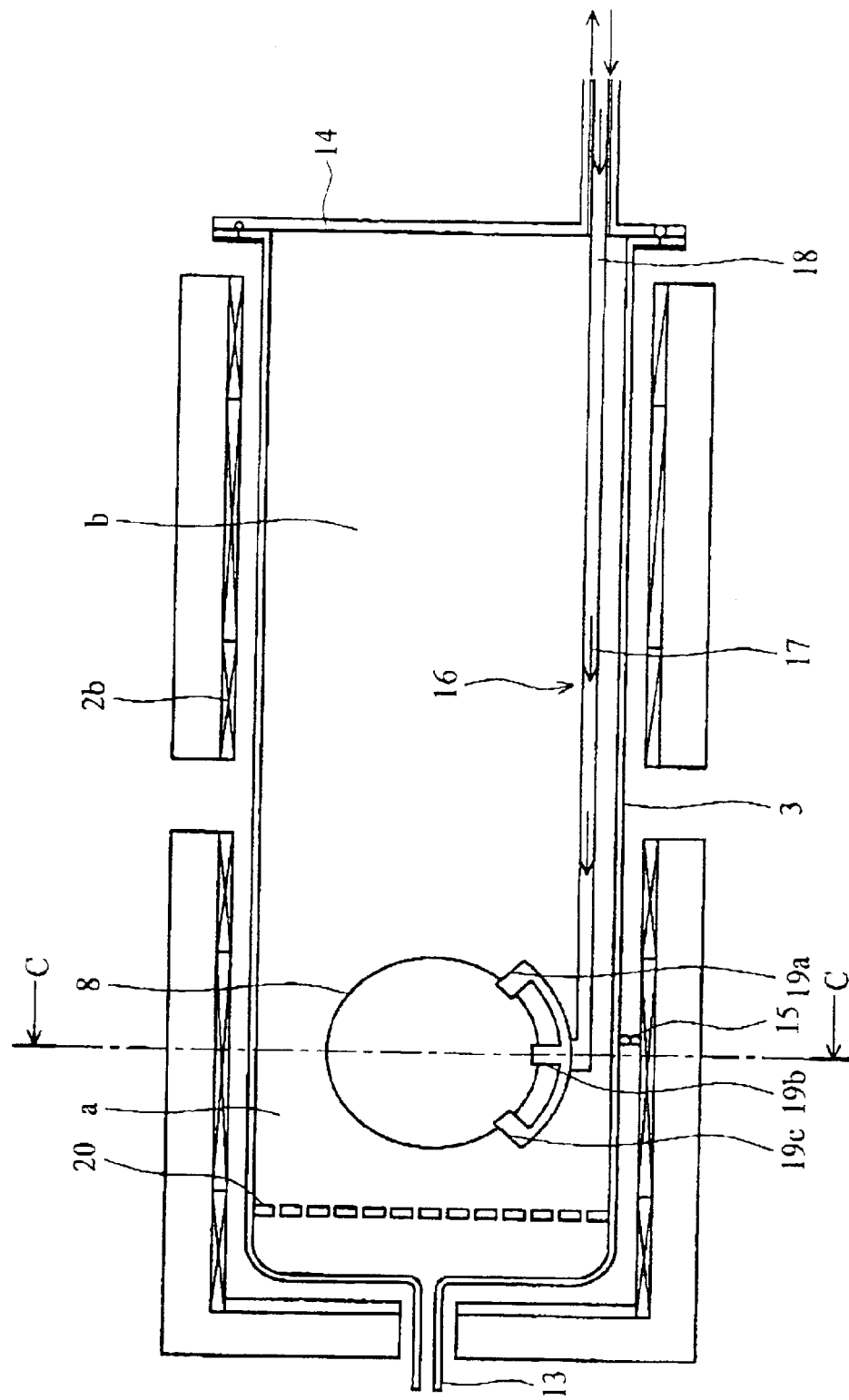
FIG. 7 is a sectional view taken from B—B of FIG. 6.

Referring now to FIG. 6 and FIG. 7, wafer 8 is held upright in a horizontal heating furnace. The furnace body 1 and the heater 2 are divided into high temperature heating zone a, where reaction occurs, and low temperature heating zone b, where wafer 8 is held at low temperature prior to reaction. As shown in FIG. 7, reference numeral 13 is an exhaust conduit, 14 is an lid for closing the inlet of the furnace, and 20 is a perforated rectifying plate in honeycomb shape for adjusting the gas flow in the reaction room. The width between furnace bodies 1a and 1b of the horizontal furnace is less than ½ of a conventional furnace, and thus the footprint is reduced.

The wafer holding jig 16 as shown in FIG. 7 comprises a hollow rod 17, and a curved arm portion 19 mounted on the front end of the hollow rod 17 for holding the wafer 8. The wafer holding jig 16 is driven by any driving means so that it can be advanced and retracted in the furnace along the low temperature heating zone b and high temperature heating zone a. 15 is a spacer. Actually, the hollow rod 17 functions both as a wafer-moving jig and a gas introduction conduit. The curved arm portion 19 is opened at an angle of 120° so as to hold the bottom portion of the wafer 8. There are three claws 19a, 19b formed on the curved arm portion 19 and protruded to the center of the wafer 8. The two claws 19a are so disposed that the extended line of each claw 19a forms an angle of 60 degree with respect to the vertical line. These two claw portions 19a have the function of preventing the wafer 8 from falling off. That is, the claws 19 can hold the peripheral portion of the wafer 8 from its two sides, and the inner portion of the claws is forked to nip the wafer 8 so as to prevent the wafer from falling off. The claw 19b, however, holds the wafer 8 from its bottom portion along the vertical line. Reaction gas is flowed in the bore of the hollow rod 17 to the reaction room. The holding of the wafer 8 by the claws 19 will be described in more detail hereinafter.

Referring to FIG. 8, an embodiment of the structure in which the reaction gas is flowed in the claws 19a is shown. The claws 19a hold the wafer 8 to prevent it from falling off. The claws 19 are mounted on the front end of the hollow rod 17, and have a structure that can hold the wafer 8 and eject reaction gas. As can be seen from FIG. 8, a space 23 that communicates with the bore of the hollow rod 17 is formed in the outer shell 21 of the claw 19a. The upper two sides of the outer shell 21 are bent to form a reversed U-shaped recessed portion 27. On the other hand, inside the outer shell 21, a U-shaped inner member 22 is disposed and is engaged in a portion of the outer shell 21. The U-shaped inner member 22 forms a part of the recessed portion 27. The silicon of the wafer 8 adheres to the quartz of the claw 19a when they are heated to a temperature of above 1000° C. and sintering reaction occurs. As long as they are in adhesion, the frictional force between them becomes larger, which usually causes a risk of production of particles. Moreover, when the completely adhered wafer 8 and outer shell 21 and inner member 22 are separated, particles are produced. However, according to the present invention, a clearance 23 is formed between the U-shaped inner portion 22 and the outer shell 21. Thus, reaction gas flows in the space formed by the U-shaped inner member 22, and escapes from the small clearance formed at the contacting portion of the wafer 8 and the quartz. As a result, it is possible to prevent the friction between the wafer 8 and the claws, and thus prevent the production of particles. Moreover, as reaction gas has a small specific heat, it is sufficiently preheated to a high temperature in the furnace and ejected out from the clearance 24, and thus the temperature distribution of the wafer 8 is not influenced.

Referring to FIG. 9 now, a structure in which the gas is ejected from the vertically formed claw 19b is shown. 25 is a room for the flow of the reaction gas from the hollow rod 16, and functions as an interior room of the communicated claws 19a. 26 is an ejection hole for the flow of inert gas, ie., a gas that does not react with the wafer, such as nitrogen gas.

Figure 10A:
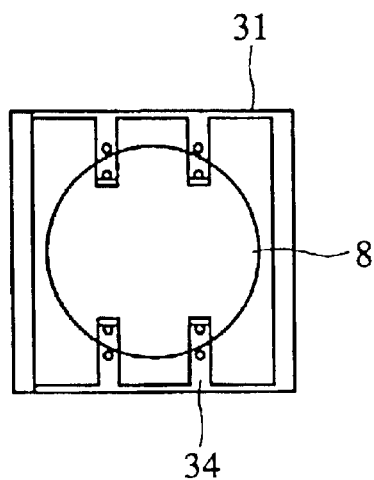
FIGS. 10a and 10b illustrate the wafer-holding jig which is horizontally disposed in a horizontal heating furnace.
Figure 10B:
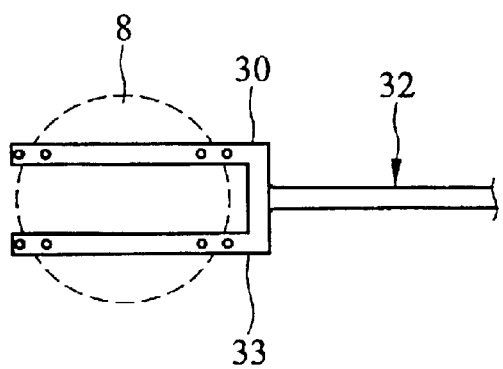

The present invention can also be applied in a horizontal heating furnace in which the wafers are horizontally held. Although an embodiment is not shown, it can be easily understood by rearranging the sides 1a, 1b of the furnace body 1 of FIG. 6 to be in the upper and lower positions. FIG. 10 is an embodiment illustrating the wafer holding jig used in this situation. As shown in FIG. 10, a different wafer-holding jig from that shown in FIG. 7 is illustrated. That is, at the front end of the rod 32 that can be advanced and retracted in the furnace, a U-shaped holding portion 30 is fixed. From the front end, eight pins 33 are protruded wherein the four inside pins hold the wafer 8 from its bottom portion. In the high temperature zone of the furnace, a holding frame 31 is disposed and similarly, eight pins 34 are protruded from the holding frame 31. After the holding portion 30 is moved to the upper side of the holding frame 31, wafer 8 is connected with pins 34 and then descends. After that, the holding portion 30 is retracted.

Figure 11:
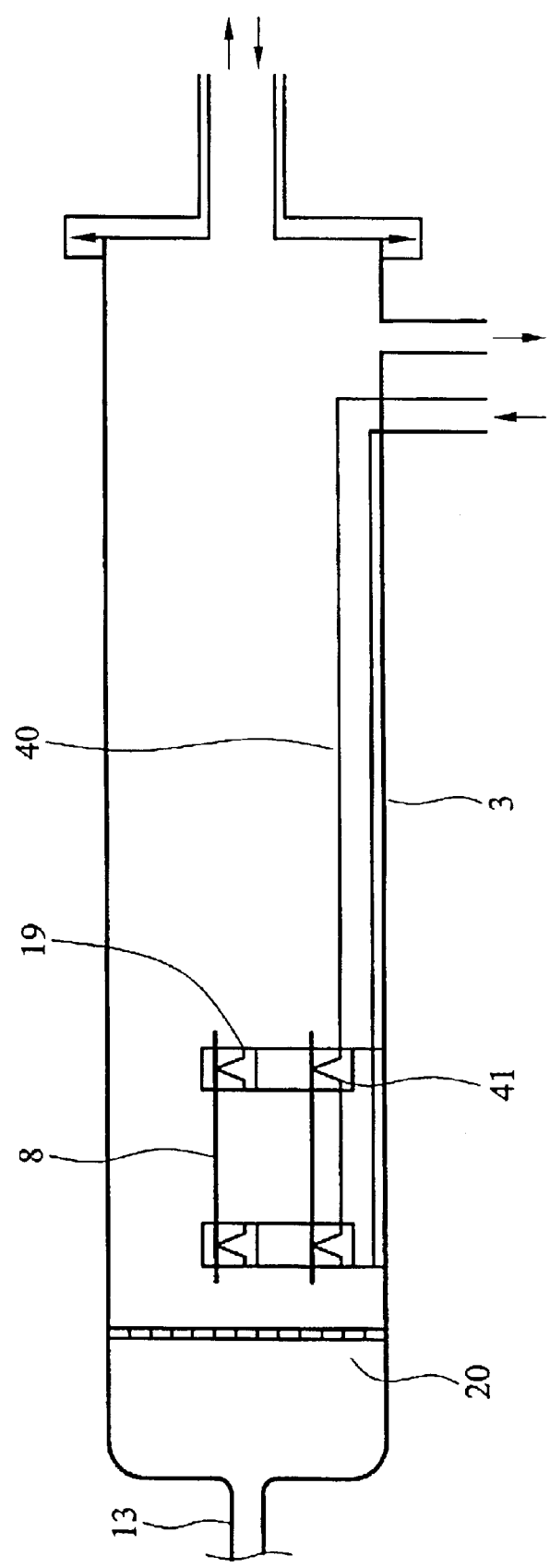
FIG. 11 is a schematic view of an assembly of a horizontal heating furnace and a horizontally disposed wafer-holding jig.
Figure 12:
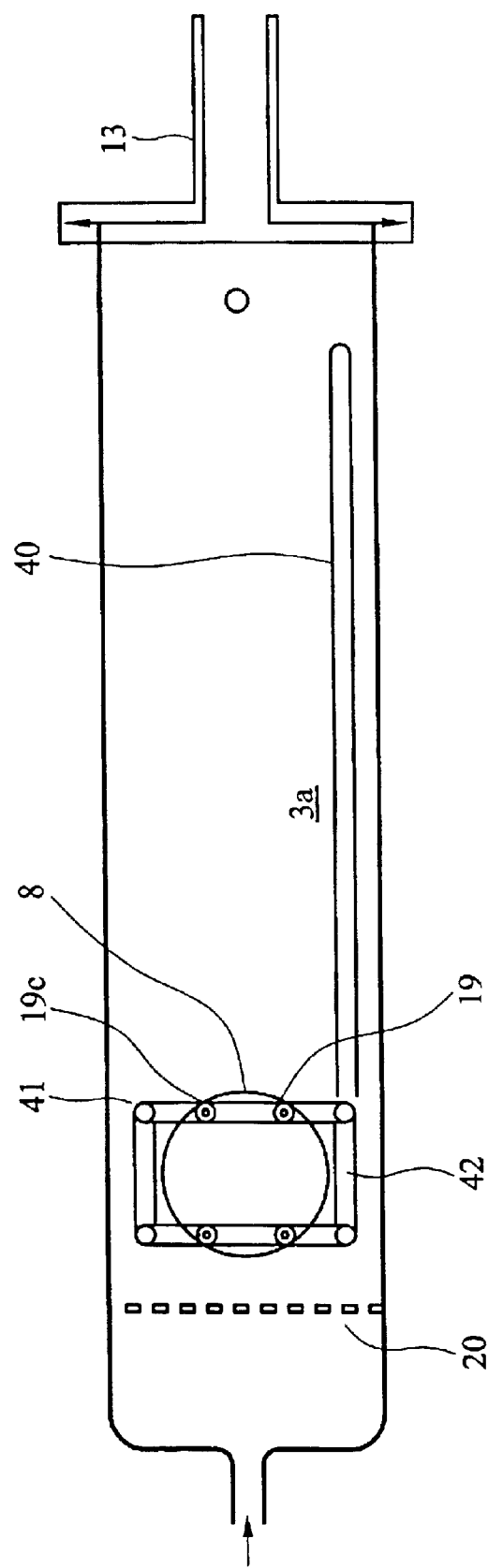
FIG. 12 is a plan view of FIG. 11.
Figure 13:
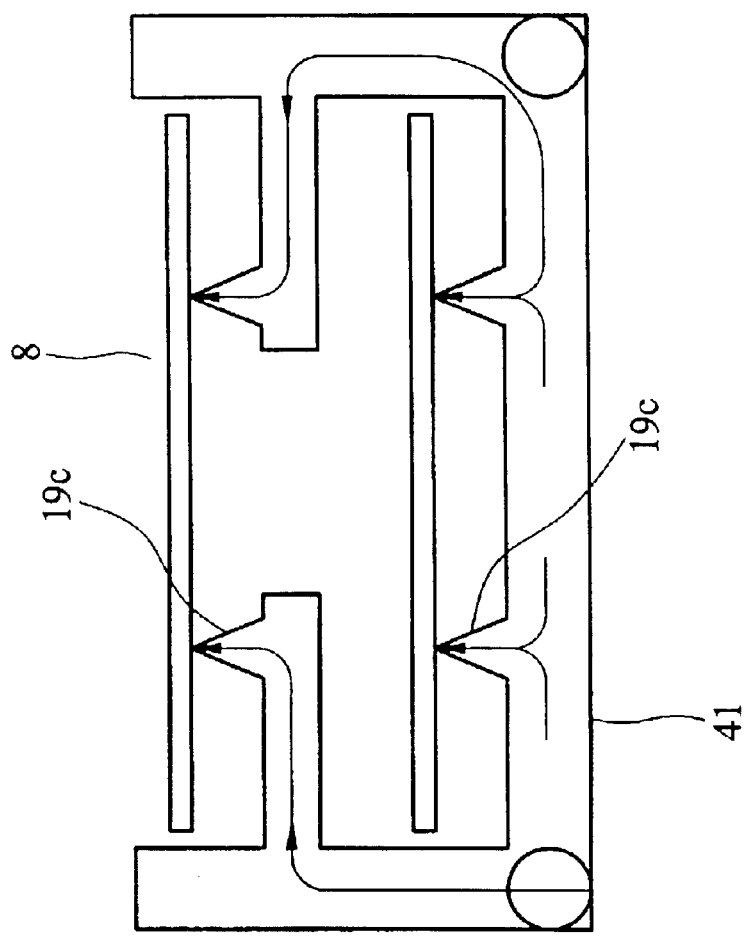
FIG. 13 is a schematic view illustrating the section of the frame shown in FIG. 11 and FIG. 12.

Referring to FIG. 11, in a horizontal furnace in which two wafers are horizontally held, when the wafers are held on one level, the occupied space is small, and by holding the wafers on multi-levels, the occupied space can be further reduced. In this case, the wafer-holding jig (not shown) is so designed that its upper and lower forks can hold respectively one wafer, and the wafers 8 can be held in an upper rack and a lower rack respectively. FIG. 11 also illustrates another method for the prevention of the sintering of wafer and quartz. Two wafers are held in a wafer rack 41 by a wafer-holding jig (not shown). Wafer 18 is held from its bottom portion by 4 claws 19c which are 90 degree separated from the wafer's center. Claws 19c are fixed on frame 42, which is short when viewing from the plan view. The frame 42 holds the flat surface 3a of the quartz reaction chamber 3 via a base (not shown). A gas introduction conduit 40 is extended from the inlet of the quartz reaction gas chamber 3 to the zone of the frame 42 of the furnace, and the gas for preventing the sintering is ejected from an ejection hole 19c opened at the front end of the claw 19c. Referring to FIG. 13, the tube 41, which constitutes the frame, can eject gas from the ejecting hole 19c and thus lift the wafer 8 slightly, so that sintering can be prevented.

Figure 10C:
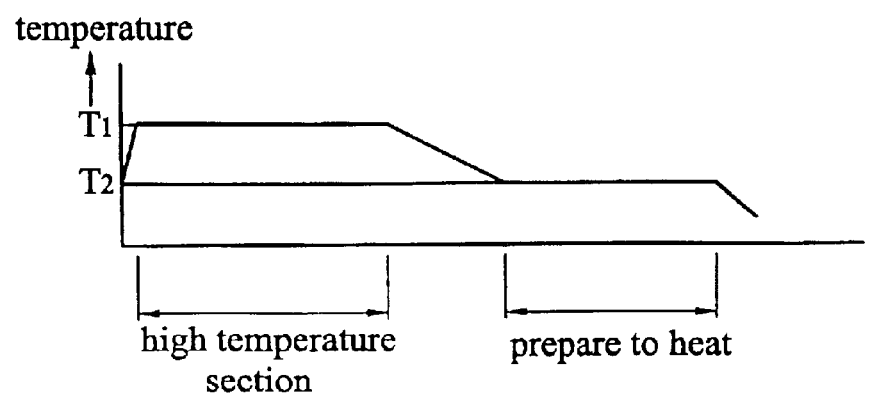
FIG. 10c is a schematic view showing the heating profile of the wafer.

Referring to FIG. 10c now, when a silicon wafer is heated by using the furnace of the invention and the high temperature section is below 700° C., the silicon wafer can be directly placed in the high temperature section for heating. However, if the high temperature section is higher than 800° C., it is preferably to place the wafer first in a uniform heating section and preliminarily heated, and then rapidly moved to the high temperature section for a rapid heating so as to reduce the stress that may be occurred in the wafer.

When a horizontal furnace as shown in FIG. 7 and FIG. 11 is used, it is also possible to follow the heating profile as illustrated in FIG. 10c. That is, the wafer can be first placed in a low temperature section for uniform heating, and then be moved to high temperature section for rapid heating.

As described above, by using the present invention, the temperature distribution of the wafers can be uniformly maintained, and the cost of the investment of the semiconductor manufacturing equipment can be saved.

What is claimed is:

1. An assembly of heating furnace and semiconductor wafer-holding jig, comprising:
   a furnace body made of refractory or heat insulting material having at least one flat surface;
   a heater disposed around the inner side surface of said furnace body;
   a reaction chamber which forms a uniform heating zone;
   a gas introduction hollow conduit disposed along the longitudinal direction of the heating furnace; and
   a wafer-holding jig capable of holding a semiconductor wafer and advancing and retracting the semiconductor wafer in the uniform heating zone along the longitudinal axes of the furnace body, the wafer-holding jig arranged such that the front surface of the semiconductor wafer is substantially in parallel with said flat surface of said heater, wherein the wafer-holding jig is disposed on the front end of said gas introduction hollow conduit, and comprises a wafer-holding portion which includes an ejection hole for ejecting a gas to the semiconductor wafer from said gas introduction hollow conduit.

2. The assembly as claimed in claim 1, wherein said heating furnace is a vertical heating furnace.

3. The assembly as claimed in claim 1, wherein said heating furnace is a horizontal heating furnace.

4. The assembly as claimed in claim 1, further comprising a plurality of thermal storage plates disposed in the uniform heating zone, wherein the thermal storage plates are of the same size, or are smaller than the semiconductor wafers, and are disposed substantially in parallel with the semiconductor wafer or between two semiconductor wafers.

* * * * *